United States Patent [19]
Lee

[11] Patent Number: 6,150,701
[45] Date of Patent: Nov. 21, 2000

[54] INSULATIVE GUARD RING FOR A SEMICONDUCTOR DEVICE

[75] Inventor: Chang Soo Lee, Daeku, Rep. of Korea

[73] Assignee: Hyundai Electronics Industries Co., Ltd., Ichon-Shi, Rep. of Korea

[21] Appl. No.: 09/056,618

[22] Filed: Apr. 8, 1998

[30] Foreign Application Priority Data

Dec. 8, 1997 [KR] Rep. of Korea ................. 97-66665

[51] Int. Cl.[7] .................................................. H01L 29/76
[52] U.S. Cl. .......................... 257/409; 257/452; 257/457; 257/510; 257/647
[58] Field of Search ........................... 257/370, 409, 257/605, 452, 457, 510, 357, 378, 494, 495; 438/140, 440, FOR 230, 647, 241, 325

[56] References Cited

U.S. PATENT DOCUMENTS

| | | | |
|---|---|---|---|
| 4,137,109 | 1/1979 | Aiken et al. | 438/325 |
| 5,319,235 | 6/1994 | Kihara et al. | 257/370 |
| 5,525,824 | 6/1996 | Himi et al. | 257/370 |
| 5,859,450 | 1/1999 | Clark et al. | 257/233 |

*Primary Examiner*—Olik Chaudhuri
*Assistant Examiner*—William David Coleman
*Attorney, Agent, or Firm*—Fleshner & Kim, LLP

[57] ABSTRACT

A semiconductor device and fabrication method thereof restrains an amplified current between input voltage Vin and ground voltage Vss, and first and second n-wells are biased into internal voltage sources, whereby the current-voltage characteristic of the input pad becomes stabilized during an open/short checkup of a semiconductor device. The semiconductor device includes a semiconductor substrate having a plurality of device isolation regions, first and second n-wells horizontally spaced from either of the plurality of device isolation regions, a p-channel transistor formed in the second n-well, an input protection transistor horizontally spaced from the first n-well and the device isolation region, on a symmetrical portion by the first n-well to the second n-well, and a guard ring formed between the first n-well and the input protection transistor.

21 Claims, 2 Drawing Sheets

INSULATIVE GUARD RING FOR A SEMICONDUCTOR DEVICE

BACKGROUND OF THE INVENTION

1. Field of the Invention

The present invention relates to a semiconductor, and more particularly to an improved semiconductor device and fabrication method thereof for forming a guard ring between n-wells provided for fabricating a peripheral circuitry adjacent to an input protection transistor, thereby stabilizing a current-voltage operation characteristic of an input pad.

2. Description of the Background Art

Among semiconductor devices, a DRAM (Dynamic Random Access Memory) refers to a memory device wherein a basic cell is provided with a selection transistor and a capacitor. A gate of the selection transistor is connected to a word line, a drain thereof is connected to a bit line, and a source thereof is connected to an electrode or the capacitor, that is, to an earthed electrode. Such a DRAM stores therein data depending upon whether there is an electrical charge loaded in the capacitor. The DRAM developed in the 1970's is still being studied for its larger integration.

FIG. 1 is a cross-sectional view illustrating a semiconductor device with regard to an input pad peripheral circuit according to a background art. As shown therein, a plurality of device isolation regions a, b, c are formed in the upper surface of a semiconductor substrate 10. A first and second n-wells 20, 30 are formed adjacent to the device isolation regions a, b in the semiconductor substrate 10. The first and second n-wells 20, 30 are isolated by the device isolation region b. In the first n-well 20 there is formed an n+ diffusion layer 21 which is connected to a first supply voltage Vdd. In the second n-well 30 there are formed an p+ diffusion layer 31 which is connected to first supply voltage Vdd, and a p+ diffusion layer 32 which is connected to a second supply voltage Vcc.

A p-channel transistor Q2 having the p+ diffusion layers 31, 32 as drain and source and having a gate electrode G2 is formed in the second n-well 30. The first supply voltage Vdd denotes an internal supply voltage generated from an externally applied supply voltage Vcc and is generally lower than the externally applied supply voltage Vcc. To the left side from the first n-well 20, there is provided an input protection transistor Q1 adjacent to the device isolation region a. The input protection transistor Q1 is an n-channel transistor. The n-channel transistor Q1 includes the gate electrode G1 formed in the upper surface of the semiconductor substrate 10, and the n+ diffusion layers 11, 12 as source and drain, respectively. The gate electrode of the input protection transistor Q1 and the n+ diffusion layer 12 are connected to a ground voltage Vss serving as a third supply voltage. The n+ diffusion layer 11 is connected to an input voltage Vin which is received from an input pad (not shown). An n+ diffusion layer 13 is horizontally spaced from the left side of the input protection transistor Q1 and adjacent to the device isolation region c, and it is connected to the third supply voltage. A horizontal npn parasite bipolar transistor Q3 is formed by the n+ diffusion layer 11 connected to the input voltage Vin of the input protection transistor Q1 and by the n+ diffusion layer 13 connected to the third supply voltage Vss.

Voltage $V_{GD}$ connected to the gate electrode G2 of the p-channel transistor Q2 denotes a voltage applied to the gate of the p-channel transistor Q2 and a voltage of 0V is applied thereto. Here, voltage $V_{BB}$ denotes a back bias voltage.

In the input pad peripheral circuitry as shown in FIG. 1, when the input voltage Vin is less than a threshold voltage Vth, the input protection transistor Q1 is turned on, thereby allowing current to flow to an input voltage Vin of the input protection transistor Q1.

Here, when a temperature goes up, electron-hole pairs are generated from a depletion region provided between the first n-well 20 and the p-type semiconductor substrate 10, whereby holes h+ flow toward the p-type semiconductor substrate 10, and electrons e− flow toward the first n-well 20.

At this time, the first n-well is in a floating state so that the received electrons e− serve to lower the voltage, whereby a forward voltage is applied between the first n-well 20 and the p-type semiconductor substrate 10. Accordingly, electrons are injected toward the p-type semiconductor substrate 10.

When electrons are injected into the p-type semiconductor substrate 10, the injected electrons are turned to a base current of parasite bipolar transistor Q3, and the current amplified as much as the gate of the transistor is applied between n+ region 11 to which is applied Vin and n+ region 13 which is connected to Vss.

As a result, when the first n-well 20 and the second n-well 30 are biased by Vdd and an open/short test is carried out, a stable current-voltage characteristic is not realized around the input pad peripheral circuitry.

That is, the input pad peripheral circuitry of the conventional DRAM device according to the conventional art has several disadvantages: firstly, because the input protection transistor Q1 is activated by a thermal carrier generated in a high temperature, there is a strong possibility of incurring an operational error in the DRAM device; and secondly, when carrying out an open/short test by biasing the n-well regions 20, 30 to the first supply voltage Vdd, the n-well regions respectively remain in a floating state, thereby incurring a device error in a high possibility.

SUMMARY OF THE INVENTION

The present invention is devised to solve the above-described problem. Accordingly, it is an object of the present invention to provide a semiconductor device and fabrication method thereof which makes it possible to realize a stabilized current-voltage characteristic during an open/short test in an input pad peripheral circuitry by forming a guard ring between an input protection transistor and a first n-well adjacent to the transistor.

To achieve the above-described object, there is provided a semiconductor device according to the present invention which includes a semiconductor substrate having a plurality of device isolation regions, first and second n-wells horizontally spaced from either of the plurality of device isolation regions, a p-channel transistor formed in the second n-well, an input protection transistor horizontally spaced from the first n-well and the device isolation region, on a symmetrical portion by the first n-well to the second n-well, and a guard ring formed between the first n-well and the input protection transistor.

Further, to achieve the above-described object, there is provided a semiconductor device fabrication method according to the present invention which includes the steps of preparing a semiconductor substrate having a device isolation region, forming a first mask pattern on a surface portion of the semiconductor substrate which is not to include first and second n-wells, implanting n-type impurities into the semiconductor substrate to form the first and second n-wells, removing the first mask pattern, forming a first gate electrode over a surface portion of the semiconductor substrate which does not include any of n-wells, and a second gate electrode over the second n-well, forming a second mask pattern on the second n-well and the second gate electrode, implanting n+ impurities into each side portion from the grist gate electrode and the first n-well which are not covered with the second mask pattern to form an n+ diffusion layer, removing the second mask pattern, forming a p+ diffusion layer on each side portion from the second gate electrode in the second n-well, and forming a guard ring along an interface between the semiconductor substrate and the first n-well.

Still further, to achieve the above-described object, there is provided a semiconductor device fabrication method according to the present invention which includes the steps of preparing a semiconductor substrate having a device isolation region, forming a third mask pattern on a surface portion of the semiconductor substrate which is not to include first, second and third n-wells, implanting n-type impurities into the semiconductor substrate to form the first, second and third n-wells, removing the third mask pattern, forming a first gate electrode over a surface portion of the semiconductor substrate which does not include any of n-wells, and a second gate electrode over the second n-well, forming a fourth mask pattern on the second n-well and the second gate electrode, implanting n+ impurities into each side portion from the grist gate electrode and the first n-well which are not covered with the fourth mask pattern to form an n+ diffusion layer, removing the fourth mask pattern, and forming a p+ diffusion layer on each side portion from the second gate electrode in the second n-well.

The object and advantages of the present invention will become more readily apparent from the detailed description given hereinafter. However, it should be understood that the detailed description and specific example, while indicating a preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

With reference to the accompanying drawings, the semiconductor device and fabrication method thereof will now be described.

Figure 1:
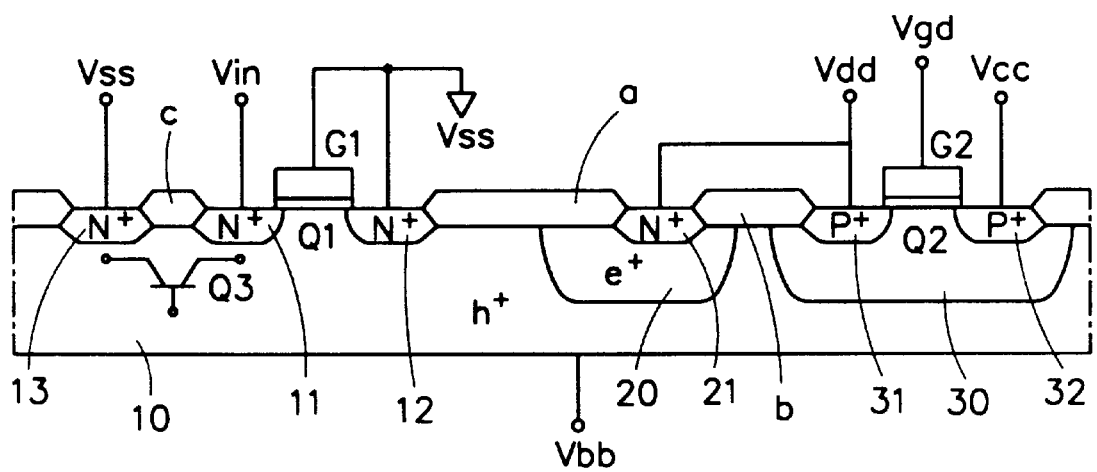
FIG. 1 is a schematic cross-sectional view illustrating a semiconductor device with regard to an input pad peripheral circuitry according to a background art.
Figure 2:
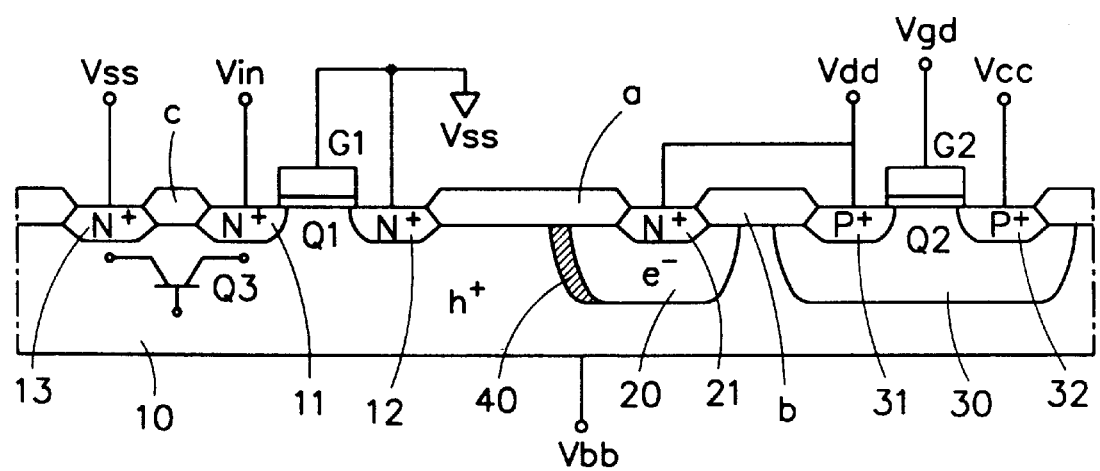
FIG. 2 is a schematic cross-sectional view illustrating a semiconductor device of an input pad peripheral circuitry according to a first embodiment of the present invention.
Figure 3:
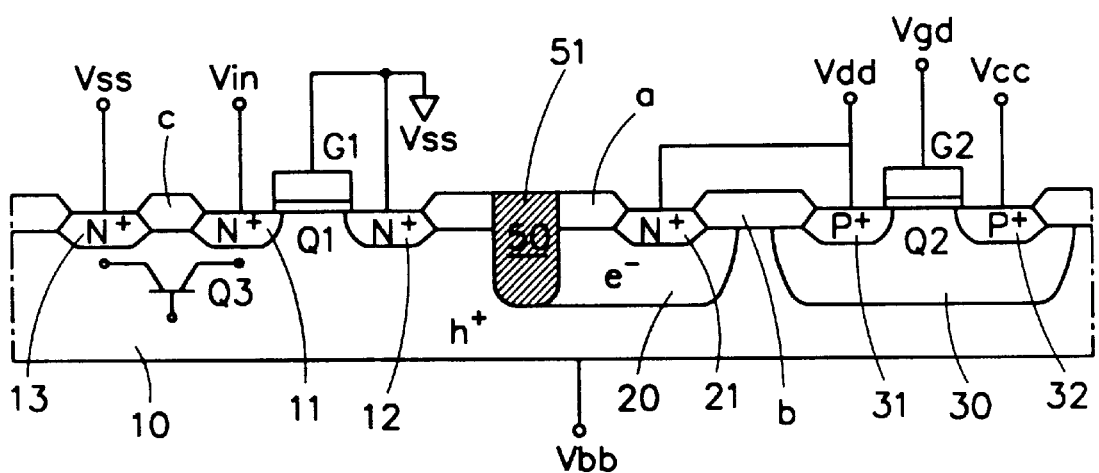
FIG. 3 is a schematic cross-sectional view illustrating a semiconductor device of an input pad peripheral circuitry according to a second embodiment of the present invention.

FIG. 2 is a cross-sectional view illustrating a semiconductor device with regard to an input pad peripheral circuitry according to the first embodiment of the present invention. As shown therein, the input pad peripheral structure of a DRAM device according to the first embodiment of the present invention is basically identical to that of the background art with the exception of a first n-well 20 and a guard ring 40 serving as an oxide film formed along a side interface of the semiconductor substrate 10.

That is, the peripheral circuit of a semiconductor device includes a plurality of device isolation regions a, b, c in the surface of the p-type semiconductor substrate 10. The first n-well 20 and the second n-well 30 are formed in a right side portion of the semiconductor substrate 10 to have the device isolation region a formed therebetween. The first n-well 20 and the second n-well 30 are spaced by the device isolation region b. An n+ diffusion layer 21 connected to the first source voltage Vdd is formed in the first n-will 20. Also, the p+ diffusion layer 31 connected to Vdd and the p+ diffusion layer 32 connected to the second source voltage Vcc are formed in the second n-well 30. A p-channel transistor Q2 has p+ diffusion layers 31, 32 as source and drain, and includes a gate electrode G2 in the second n-well 30. The Vdd denotes an internal source voltage generated from an externally generated source voltage Vcc and it has a lower voltage than a common Vcc. An oxide film 40 serving as a guard ring is formed on at least one side boundary between the first n-well 20 and the semiconductor substrate 10. Also, an input protection transistor Q1 is horizontally spaced from the device isolation region a in the left side of the first n-well 20. Here, the input protection transistor Q1 is an n-channel transistor. The n-channel transistor Q1 includes a gate electrode G1 formed in an upper portion of the semiconductor substrate 10, and n+ diffusion layers 11, 12 formed in each side of the gate electrode G1 respectively serves as source and drain of the n-channel transistor Q1. The gate electrode G1 of the input protection transistor Q1 and the n+ diffusion layer 12 are connected to ground voltage Vss serving as a third source voltage, and the n+ diffusion layer 11 is connected to an input voltage Vin outputted from the input pad (not shown). The n+ diffusion layer 13 connected to the third source voltage is formed to the left side of the device isolation region C which is spaced from the input protection transistor Q1. A horizontal npn parasite bipolar transistor Q3 is formed by the n+ diffusion layer 11 connected to the input voltage Vin of the input protection transistor Q1 and the third source voltage Vss.

Ground voltage $V_{GD}$ connected to a gate electrode G2 of the p-channel transistor Q2 denotes a voltage which is to be applied to the gate of the p-channel transistor Q2, and 0V is applied thereto. Voltage $V_{BB}$ denotes a back bias voltage.

The semiconductor device fabrication method according to the first embodiment of the present invention will now be described.

First, a plurality of device isolation regions a, b, c are formed in the p-type semiconductor substrate 10. Then, a first mask pattern is formed on the upper surface of the semiconductor substrate other than the regions for forming first and second n-wells 20, 30, and n type impurities are implanted into the semiconductor substrate for thereby forming the first and second n-wells 20, 30.

Then, the first mask pattern is removed.

The first and second gate electrodes G1, G2 are formed over a left side portion of the device isolation region a of the semiconductor substrate 10 and over the second n-well 30.

A second mask pattern is formed on the upper surface of the second n-well 30, and n+ impurities are implanted into each side portion of the first gate electrode G1 and the first n-well 20 to form n+ diffusion layers 11, 12, 13, 21.

Then, the second mask pattern is removed.

A third mask pattern is formed to cover an entire structure of the semiconductor substrate other than the second n-well 30, and p-type impurities are ion-implanted into the well 30 on each side of the second gate electrode G2 which is provided over the second n-well 30.

As a result, the parasite bipolar transistor Q3 and the input protection transistor Q1 serving as the n-channel transistor are formed to the left side of the first n-well 20, and the p-channel transistor Q2 is formed to the right side of the first n-well 20 and in the second n-well 30.

Oxygen ions are implanted into an interface of the first n-well 20 and the semiconductor substrate 10 by use of an ion-implanting technique, and annealed to form an oxygen film serving as a guard ring 40 along the interface, thereby completing the fabrication steps according to the first embodiment of the present invention.

The specific operational characteristics of the semiconductor device fabricated according to the above-described steps will now be explained.

When Vin is less than threshold voltage Vth of the input protection transistor Q1, the input protection transistor Q1 is turned on, so that there flows a current in the source voltage Vin of the input protection transistor Q1. When the temperature is raised in the above state, there are formed pairs of electrons $e^-$ holes $h^+$, so that the holes $h^+$ flow towards the p-type semiconductor substrate 10 and the electrons $e^-$ flow towards the first n-well 20.

At this time, the first n-well 20 is in a floating state, so that the generated electrons cause the voltage of the first n-well 20 to become lower, and accordingly when a forward direction voltage is applied between the first n-well 20 and the p-type semiconductor substrate 10, the electrons are injected toward to the p-type semiconductor substrate 10. Here, when the electrons are injected into the p-type semiconductor substrate 10, the guard ring 40 serves to prevent the electrons from being moved toward the base of the parasite bipolar transistor Q3.

Consequently, when the guard ring 40 is not formed, the injected electrons are turned to a base current of the parasite bipolar transistor Q3, so that an amplification current is prevented from occurring between the source input terminal Vin and the ground voltage Vss.

The structure of the input pad peripheral circuitry of a semiconductor device according to the second embodiment of the present invention will now be described.

Instead of the guard ring 40, a trench 50 is formed along an interface between the first n-well 20 and the semiconductor substrate 10, and an oxide film 51 is formed inside the trench 50. The other fabrication steps for the second embodiment is identical to those of the first embodiment of the present invention.

The fabrication steps of the semiconductor device according to the second embodiment of the present invention will now be described.

In accordance with the fabrication steps adopted in the first embodiment of the present invention, there are formed an input protection transistor Q1, a first n-well 20, a second n-well 30, and a p-channel transistor Q2 in the semiconductor substrate 10.

Instead of injecting oxygen ions along an interface between the first n-well 20 and the semiconductor substrate, a trench 50 is formed adjacent to the interface. Here, an anisotropic technique is employed to form the trench 50.

Then, the trench 50 is filled with an oxide film 51 by use of a high-temperature low-pressure deposition (HLD) method.

Figure 4:
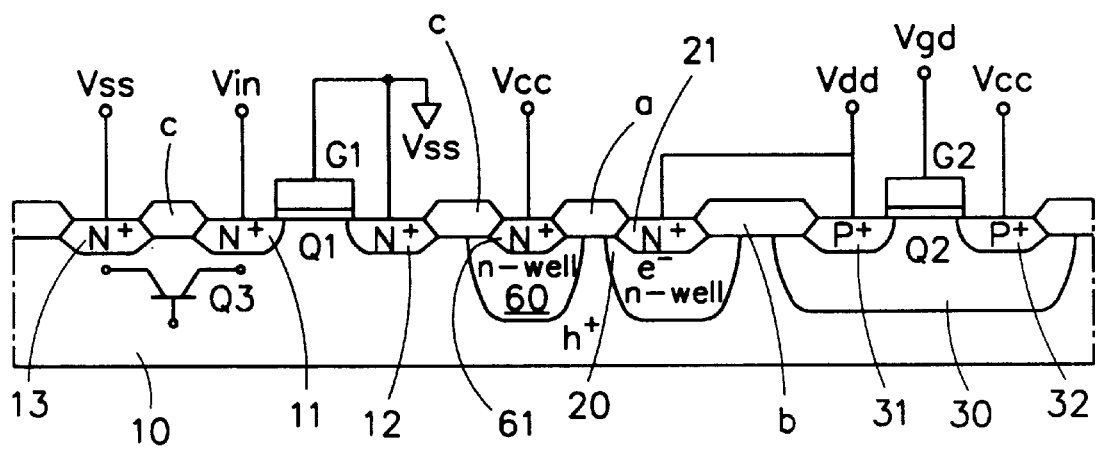
FIG. 4 is a schematic cross-sectional view illustrating a semiconductor device of an input pad peripheral circuitry according to a third embodiment of the present invention.

FIG. 4 is a cross-sectional view illustrating an input pad peripheral circuitry of a semiconductor device according to the third embodiment of the present invention. As shown therein, the input pad peripheral circuit structure according to the third embodiment of the present invention includes a third n-well 60 formed between a first n-well 20 and the input protection transistor Q1, and an n+ diffusion layer 61 formed on the surface of the third n-well 60 is connected to second source voltage Vcc, wherein the structure other than those elements is identical to that of the conventional art.

The operation principles of the third embodiment of the present invention are as follows.

Under a high temperature, pairs of electron-hole are generated between the first n-well 20 and the semiconductor substrate 10. The holes travel towards the p-type semiconductor substrate 10, and the electrons move towards the first n-well 20, so that there is formed a forward direction bias between the semiconductor substrate 10 and the first n-well 20, and accordingly the electrons move again towards the p-type semiconductor substrate 10. At this time, the third n-well 60 is connected to the second source voltage Vcc, which is higher than the first source voltage Vdd. Therefore, the electrons injected from the first n-well 20 towards the p-type semiconductor substrate 10 are guided towards the third n-well 60 having a high voltage to become a base current of the parasitic bipolar transistor Q3 of the p-type semiconductor substrate 10, thereby restraining the amplification of a current which flows between the input source terminal Vin and the n+ diffusion layer 13 which receives the voltage Vss and accordingly stabilizing a source voltage characteristic of the input pad periphery.

The fabrication method of the semiconductor device according to the third embodiment of the present invention will now be described.

First, a plurality of device isolation regions a, b, c, d, e are formed in the upper surface of the p-type semiconductor substrate 10.

A third mask pattern (not shown) is formed on the upper surface of the semiconductor substrate 10 other than regions in which first, second and third n-wells 20, 30, 60 are to be formed.

Then, n-type impurities are implanted into the surface portion of the semiconductor substrate 10 which is not covered by the mask pattern (not shown) to form the first, second and third n-wells 20, 30, 60.

Next, the third mask pattern (not shown) is removed.

A first and second gate electrodes G1, G2 are formed over the surface portion of the semiconductor substrate 10 which does not includes any of n-wells and over the second n-well 30.

Then, the second n-well 30 is covered by a fourth mask pattern (not shown).

Thereafter, n+ impurities are implanted into each side portion of the first gate electrode G1 and into the first and third wells 20, 60 to form n+ diffusion regions 11, 12, 13, 21, 61, and then the fourth mask pattern (not shown) is removed.

A new mask pattern (not shown) is formed on the surface of the semiconductor substrate 10 with the exception of the upper surface of the second n-well 30, and p+ impurities are implanted into each side from the second gate electrode G2 on the second n-well 30 to form p+ diffusion regions 31, 32.

As a result, the third n-well 60 is formed between the first n-well 20 and the n-channel input protection transistor Q1 so as to serve as a guard ring.

As described above, the guard ring is formed between the input protection transistor Q1 and its peripheral n-well to restrain an amplified current between the input voltage Vin and the ground voltage Vss, and the first and second n-wells of the input pad peripheral circuit are biased into internal voltage sources, whereby the current-voltage characteristic of the input pad becomes stabilized during an open/short checkup of a DRAM device.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A semiconductor device, comprising:

a substrate of a first conductivity type having a plurality of device isolation regions;

first and second wells of a second conductivity type formed in the substrate and separated from each other by one of the plurality of device isolation regions;

a first transistor formed in the second well;

an input protection transistor spaced from the first well and the device isolation region, such that the device isolation region is positioned between the input protection transistor and the first well; and a guard ring formed of an insulator and located between the first well and the input protection transistor and along an interface along the substrate and the first well, such that the guard ring faces the input protection transistor.

2. The semiconductor device of claim 1, wherein the guard ring is an oxide.

3. The semiconductor device of claim 1, wherein oxygen is ion-implanted into the interface between the substrate and the first well and annealed to form the guard ring.

4. A semiconductor device, comprising:

a substrate of a first conductivity type having a plurality of device isolation regions;

first and second wells of a second conductivity type formed in the substrate and separated from each other by one of the plurality of device isolation regions;

a first transistor formed in the second well;

an input protection transistor spaced from the first well and the device isolation region, such that the device isolation region is positioned between the input protection transistor and the first well; and a guard ring formed between the first well and the input protection transistor.

wherein a trench is formed through the substrate and the device isolation region, and an insulator is formed in the trench to form the guard ring.

5. A semiconductor device, comprising:

a substrate of a first conductivity type having a plurality of device isolation regions;

first and second wells of a second conductivity type formed in the substrate and separated from each other by one of the plurality of device isolation regions;

a first transistor formed in the second well;

an input protection transistor spaced from the first well and the device isolation region, such that the device isolation region is positioned between the input protection transistor and the first well; and a guard ring formed between the first well and the input protection transistor.

wherein the guard ring is a well having a diffusion layer on a surface thereof, and the diffusion layer receives a voltage higher than the voltage applied to the first well.

6. The semiconductor device of claim 1, wherein the input protection transistor is an n-channel MOS transistor.

7. The semiconductor device of claim 1, wherein an input voltage is applied from an input pad to one of a source and a drain of the input protection transistor, and a ground voltage is applied to the rest of the source and the drain of the input protection transistor.

8. The semiconductor device of claim 1, wherein a ground voltage is applied to the gate electrode of the input protection transistor.

9. The semiconductor device of claim 1, wherein the first conductivity type is a p type and the second conductivity type is an n type.

10. The semiconductor device of claim 4, wherein the first transistor is a p-channel transistor.

11. The semiconductor device of claim 4, wherein the input protection transistor is an n-channel MOS transistor.

12. The semiconductor device of claim 4, wherein an input voltage is applied from an input pad to one of a source and a drain of the input protection transistor, and a ground voltage is applied to the rest of the source and the drain of the input protection transistor.

13. The semiconductor device of claim 4, wherein a ground voltage is applied to the gate electrode of the input protection transistor.

14. The semiconductor device of claim 4, wherein the first conductivity type is a p type and the second conductivity type is an n type.

15. The semiconductor device of claim 4, wherein the first transistor is a p-channel transistor.

16. The semiconductor device of claim 5, wherein the input protection transistor is an n-channel MOS transistor.

17. The semiconductor device of claim 5, wherein an input voltage is applied from an input pad to one of a source and a drain of the input protection transistor, and a ground voltage is applied to the rest of the source and the drain of the input protection transistor.

18. The semiconductor device of claim 5, wherein a ground voltage is applied to the gate electrode of the input protection transistor.

19. The semiconductor device of claim 5, wherein the first conductivity type is a p type and the second conductivity type is an n type.

20. The semiconductor device of claim 5, wherein the first transistor is a p-channel transistor.

21. The semiconductor device of claim 5, wherein the well of the guard ring is an n-type and the diffusion layer is an n+ type.

* * * * *